United States Patent [19]

Maslakow

[11] Patent Number: 5,194,695

[45] Date of Patent: Mar. 16, 1993

[54] THERMOPLASTIC SEMICONDUCTOR PACKAGE

[75] Inventor: William H. Maslakow, Lewisville, Tex.

[73] Assignee: AK Technology, Inc., Dallas, Tex.

[21] Appl. No.: 609,163

[22] Filed: Nov. 2, 1990

[51] Int. Cl.$^5$ .................... H01L 23/02; H01L 21/60; B32B 31/16

[52] U.S. Cl. .................. 174/52.4; 156/73.1; 437/209; 437/210; 437/215; 437/216; 257/678

[58] Field of Search ................ 174/52.2, 52.4; 357/72, 357/73, 74; 437/209, 210, 215, 216, 217, 218; 156/73.1, 81; 29/592.1

[56] References Cited

U.S. PATENT DOCUMENTS

| | | |
|---|---|---|
| 4,189,825 | 2/1980 | Robillard et al. . |
| 4,211,923 | 7/1980 | Fukuyama et al. . |
| 4,248,356 | 2/1981 | McCarthy et al. . |
| 4,250,419 | 2/1981 | Zolman . |
| 4,430,634 | 2/1984 | Hufford et al. . |
| 4,438,880 | 3/1984 | Smith et al. . |
| 4,499,995 | 2/1985 | Turner . |
| 4,533,587 | 8/1985 | Moodie et al. . |
| 4,551,785 | 11/1985 | Kroner . |
| 4,682,270 | 7/1987 | Whitehead et al. ................ 361/401 |
| 4,769,344 | 9/1988 | Sakai et al. ......................... 437/216 |
| 4,786,259 | 11/1988 | Paul . |
| 4,833,495 | 5/1989 | Ohmura et al. . |
| 4,911,301 | 3/1990 | Dieffenbach . |
| 4,935,581 | 6/1990 | Komathu ........................... 174/52.4 |

FOREIGN PATENT DOCUMENTS

| | | |
|---|---|---|
| 56-81957 | 7/1981 | Japan . |
| 58-78444 | 5/1983 | Japan . |
| 62-144348 | 6/1987 | Japan . |

Primary Examiner—Leo P. Picard
Assistant Examiner—Bot Ledinh
Attorney, Agent, or Firm—John F. A. Earley; John F. A. Earley, III

[57] ABSTRACT

A semiconductor package includes a lead frame with a die or chip mounted on a die pad, a base made of a thermoplastic material and having a cavity, and a lid made of thermoplastic material ultrasonically welded to the base to cover the cavity and protect the electronic device in the package. The package may include a substrate with conductive traces. A method of attaching a lid to a semiconductor package base includes the steps of providing a semiconductor package base having an open cavity, providing a thermoplastic lid that covers the open cavity, placing the lid on the semiconductor package base so that the lid covers the open cavity, applying pressure to hold the lid and body together, and attaching the lid to the base by ultrasoncially welding them together.

12 Claims, 7 Drawing Sheets

THERMOPLASTIC SEMICONDUCTOR PACKAGE

BACKGROUND OF THE INVENTION

1. Field of the Invention

This invention relates to a thermoplastic semiconductor package and to a method of making it, and more particularly concerns attaching a thermoplastic lid or cover to a thermoplastic cavity type semiconductor package body by ultrasonic welding. The semiconductor package may be a Plastic Quad Flat Pack package (PQFP) as shown in FIGS. 1 and 11, Plastic Dual In-Line Package (PDIP) as shown in FIGS. 3 and 13, or a Plastic Pin Grid Array package (PPGA) as shown in FIG. 5, and may include Small Outline Integrated Circuit (SOIC) variations, but is not limited thereto. The semiconductor package may include single or multiple Integrated Circuit (IC) arrangements.

The term "Plastic Cavity Type Semiconductor Package" refers to any type of semiconductor package that provides for the mounting of an integrated circuit die onto the die pad of the semiconductor package through a recess or cavity in the semiconductor package, subsequently adding electrical interconnections and sealing the electrical components by applying a sealant over the wires and die.

The terms "lid" or "cover" as used in this disclosure are interchangeable, and refer to any component that is attached to the main body of a semiconductor package to protect the internal components of the semiconductor package, such as the integrated circuit, from environmental or physical damage or contamination. The design of the lid may be such to fit within the constraints of a cavity in the semiconductor package body. Alternatively, if desired, the lid may be an integral component of the overall cover of the device. The term lid does not define top or bottom.

The term "ultrasonic welding" refers to a method of welding elements together by producing an intense, controlled vibration from an ultrasonic welding booster horn and applying it to the elements to be welded. This intense controlled vibration, coupled with an application of a set pressure against the components to be welded, develops frictional heat which causes melting of one or both of the components at the interface between the components, and creates a mechanical bond between the components.

A plastic cavity type semiconductor package is a practical vehicle for the mounting of a subminiature integrated circuit to printed circuit or wiring board. Plastic cavity-type semiconductor packages contain an integrated circuit which is electrically interconnected to an integral polyester, epoxy or polyimide resin base laminated substrate with an integral electrical circuit, or to an integral conductive lead frame. The substrate circuit or lead frame enlarges the effective pitch, or spacing, between electrical connections of the integrated circuit to a practical, useable dimension found on printed circuit or wiring boards. The method of enlargement may be by a flexible or rigid substrate circuit, a stamped or chemically etched conductive lead frame, or a combination of a substrate circuit and a conductive lead frame.

The ways of mounting a plastic cavity type semiconductor package onto a printed circuit or wiring board varies from insertion or through hole mounting to surface mounting.

The particular way of mounting dictates the arrangement of the electrical leads that interface with the printed circuit or wiring board.

The method of pitch enlargement typically utilized for Plastic Quad Flat Pack (PQFP) and Plastic Dual In-Line Packages (PDIP) ma be either an integral substrate circuit electrically connected to the internal ends of a lead frame, whereby the external ends of the lead frame interface the printed circuit or wiring board, or an integral lead frame whereby the integrated circuit is electrically connected to the internal ends of the lead frame and the external ends interfacing the printed circuit or wiring board. The interface may be a surface mount or insertion type interface.

The method of enlargement typically utilized for a Plastic Pin Grid Array, (PPGA) may be an integral substrate circuit electrically connected to the internal ends of a conductive pin, whereby the pins form a matrix pattern and provide electrical connection to the printed circuit or wiring board by inserting the external ends of the conductive pin matrix into the printed circuit or wiring board.

Upon mounting the integrated circuit or die onto the die pad, a series of wire interconnections, or wire bonds, are made between the integrated circuit and the internal leads of a lead frame, or to a substrate circuit. In applications requiring sealed integrated circuits, a sealant is applied on and about the integrated circuit and the wire bond interconnections.

Plastic cavity type semiconductor packages are offered in various formats. Plastic Pin Grid Arrays, PPGA, for example, are available in a bare substrate circuit and pin matrix in which all the components compromising the semiconductor package are visible. A cavity, or recess, is designed into the substrate circuit for mounting of an integrated circuit die.

The PPGA is also available with the substrate circuit, and the interface of the pin matrix and the substrate circuit, pre-molded or encapsulated with a plastic molding compound. A cavity is designed into this package body for mounting an integrated circuit die and for electrically interconnecting the die to the substrate circuit.

The end user provides for the integrated circuit die mounting, the electrical interconnection of the integrated circuit to the substrate circuit and the protection of the integrated circuit by the application of a sealant or lid onto the semiconductor package.

In the case of a bare semiconductor package, a typical method of providing protection to the integrated circuit and electrical interconnection against environmental or physical damage involves the total encapsulation of the bare package with a molding compound, or the application of a "Blob Top", by placing a suitable quantity of sealant, in the cavity on top of the integrated circuit and electrical interconnections, and curing the sealant by applying heat or ultraviolet rays.

In the case of the pre-molded or encapsulated cavity package, a typical method of providing protection to the integrated circuit and electrical interconnection involves applying a "Blob Top" or attaching a lid over the cavity. In a typical lidding process, a suitable amount of adhesive is applied about the cavity opening or on the lid or, in some cases, both. The lid and package body are then mated together and allowed to cure by applying heat or ultraviolet rays. The actual application of the adhesive may be by dispensing a liquid material, screen printing a paste material, or applying a preformed adhesive material blank onto the components to be mated.

The disadvantages of the current methods of protecting the integrated circuit in a Plastic Cavity-Type Semiconductor Package include the following:

a. Adhesive bonding of the lid to the semiconductor package is a time consuming process that involves subjecting the assembly to possible contamination by the adhesive bonding agents.

b. Adhesive bonding agents, and sealing agents, curable by any method, are hydroscopic compounds which absorb moisture, and this moisture is introduced into the cavity and onto the electrical components, causing corrosion and failure.

c. Moisture within a lidded plastic cavity semiconductor package causes an increase in pressure within the cavity when subjected to elevated temperatures, such as soldering. The increase in pressure, due to the expansion of the moisture, raises internal pressures to a level which may cause the lid to separate from the assembly.

d. Encapsulation, or Blob Topping, is a time consuming process which involves subjecting the assembly to possible contamination by the sealing agent, possible failure of the assembly due to moisture introduction, and possible failure of the assembly due to thermal induced stress, and may cause separation or disconnection of the wire bond from the integrated circuit, or separation of the electrical interconnection to the semiconductor package. Heat curing of the sealant also causes thermal induced stress.

e. Over molding semiconductor packages with a plastic mold compound involves subjecting the assembly to possible wire sweeping, which occurs during the injection of the plastic molding compound. Wire sweeping may cause shorting between adjacent wire bonds, or may cause separation or disconnection of the wire bonds from the integrated circuit, or the electrical interconnection to the semiconductor package.

f. Stress critical integrated circuits may not be subjected to multiple cycles of elevated temperature, as the integrated circuit may crack or disconnect from the die mount surface. Failures due to stress cracking are increased by thermal cycling. An example of multiple thermal cycling: Die attaching requires the introduction of heat to cure the bonding agent, and Blob Topping requires heat to cure the sealant, and over molding, which is performed at elevated temperatures.

g. Additional handling of a semiconductor package during the process of adhesive bonding or sealing involves subjecting the assembly to possible contamination or physical damage which may cause failure.

h. A major disadvantage in the assembly of an over-molded or blob topped semiconductor package is noticed during thermal cycling. The differences in the coefficients of thermal expansion, the rate in which a material expands or contracts in response to temperature changes, of the integral components, i.e., the die, the die attach agents, the wire interconnections, the encapsulation material, and so on, are such that when the assembly is subjected to thermal cycling, multiple exposures to hot and cold temperatures, the components expand or contract at different rates. Thermal cycling causes stress and/or strain upon the components due to the differences in those rates and may cause component failure due to wear out, disassociation of surfaces, or fractures of the integral components. Also, the larger dies which are now utilized, include integral fine line geometry. During thermal cycling, the differences in thermal expansion may cause the fine line geometry to crack or separate due to the stresses upon the die surface caused by the expansion of the encapsulation material against the die surface. This is an increasing occurrence due to the increased use of large, fine line geometry, stress critical dies. Another disadvantage of thermal cycling and the problem associated with thermal expansion, is the additional potential for failure due to corrosion or lid separation. As the integral components expand and/or contract during thermal cycling, pockets or voids are created. These pockets or voids allow moisture to gather. Moisture within a semiconductor package causes failures due to corrosion or increase in internal package pressure.

SUMMARY OF THE INVENTION

It is an object of this invention to provide a method of bonding a lid to a pre-molded thermoplastic semiconductor package body that eliminates the need for applying an adhesive bonding agent to the lid and/or to the package body.

In the present invention, a thermoplastic lid, with integrated energy directors comprising pointed ridges extending from the inner face of the lid around its perimeter, is adhered or attached to a plastic cavity type semiconductor package body by ultrasonic welding. The lid may be injection molded, and may be an amorphous, semi-amorphous, or crystalline compound. Crystalline material is presently preferred because it is more resistant to moisture. The type of semiconductor package I am concerned with includes, but is not limited to, a Plastic Quad Flat Pack Package (PQFP), a Plastic Dual In-Line Package (PDIP) or a Plastic Pin Grid Array Package (PPGA), and may include Small Outline Integrated Circuit (SOIC) Variations. The packages may include single or multiple Integrated Circuits (I.C.) arrangements.

In attaching the lid to the package body by ultrasonic welding, frictional heat is developed by placing the lid on the package body, applying a set clamping pressure to the lid and the body, and applying an intense vibration from an ultrasonic welding horn booster assembly to the lid, which is free-floating in that it is not held in place by a fixture, while the package body is held in place by a fixture. The intense vibration is transmitted through the lid-integrated energy directors to the package base to increase the temperature in the lid and package base, melt the ridges and weld the two elements together. The increase in temperature is above ambient, and at or above melting temperature of the plastic components, to provide a flow of melted plastic material from lid-integrated energy directors, and from the interface between the energy directors and the package base, which forms a mechanical, semi-hermetic bond between the lid and the base.

An inert gas may be directed toward the interface between the lid and the package base through a nozzle or inert gas curtain, to disperse and/or remove potentially contaminated or polluted air or moisture from the lid-package base interface, the cavity of the package, and surrounding areas.

DETAILED DESCRIPTION

Figure 1:
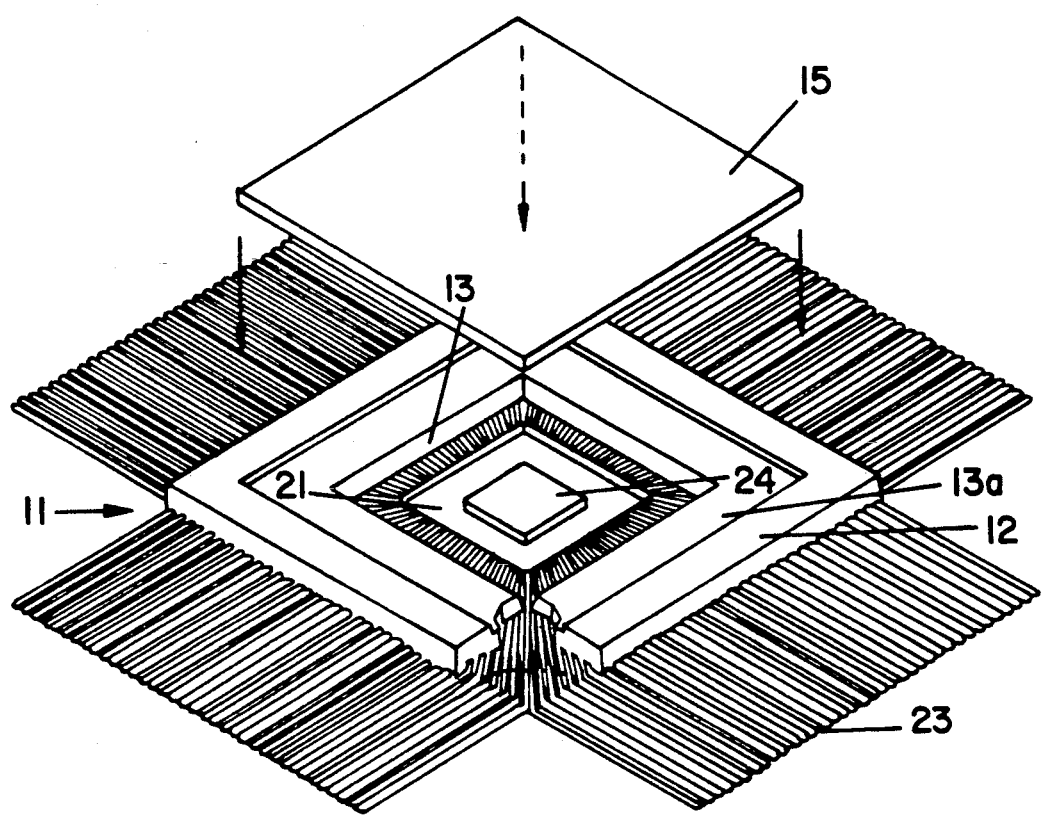
FIG. 1 is an exploded isometric view of a plastic quad flat pack cavity type semiconductor package with a lid, illustrating a combination of a substrate circuit and lead frame, and shows a broken-away corner of the package.

Turning now to the drawings, there is shown in FIG. 1 a semiconductor package 11 having a body or base 12 with an open cavity 13 and a lid 15 that is affixed to the top of semiconductor package base 12 to cover the cavity 13.

Semiconductor package 11 is a cavity type plastic quad flat pack package, and as shown in FIG. 1, semiconductor package 11 includes a single stage injection molded thermoplastic base or body 12, preferably made of BR-77 RYTON thermoplastic sold by Phillips Petroleum Company, Bartlesville, Okla., a high temperature polyimide substrate 19 with conductive traces 20, an integrated alloy heat sink 21 of a lead frame 23 with external leads 25, and a die 24 mounted on die pad 21.

The bottom, sides and top of body 12 are injection molded in one step. Lead frame 23 includes alloy and plating as required, with an integral retention feature provided by enlarged portions 29 of external leads 25. The thermoplastic material of body 12 forms around enlarged lead portions 29 to prevent pull out of the leads 25 from the body 12.

Lid 15 is made of a thermoplastic material, typically of BR-77 RYTON thermoplastic sold by Phillips Petroleum Co., Bartlesville, Okla., and is also injection molded. Lid 15 may be amorphous, semi-amorphous or crystalline in structure, just so long as it is weldable by ultrasonic welding. Lid 15 includes integrated energy directors, ridges 30 (FIGS. 6-10) which have sides 30a, 30b that slant to a line 30c, that direct the waves of ultrasonic energy to the line 30c in contact with the frame 13a of cavity 13. Semiconductor package 11 may include a single die 24 or multiple dies.

Lid 15 is attached to semiconductor package base 12 by ultrasonic welding. In the ultrasonic welding process, a set clamping pressure is supplied to lid 15 which is mounted on base 12 that is held in a fixture, and an intense vibration from an ultrasonic welding horn booster assembly is applied to the lid 15 which is not held in a fixture and is free floating. The intense vibration is transmitted through the integrated energy directors 30 in lid 15 to plastic cavity-type semiconductor package base 12 which is held in a fixture during the welding operation, and increases the temperature of lid 15 and semiconductor package base 12 to melt the directors 30, shown partly melted in FIGS. 7 and 8 and almost fully melted in FIG. 9.

The increase in temperature is above ambient, and above the melting temperature of semiconductor package base 12 and lid 15, typically above 545° F., so that a flow of melted plastic material from the integrated energy directors 30 of lid 15 and the interface between the energy directors 30 and the package base 12 forms a mechanical, semi-hermetic bond between lid 1 and plastic cavity-type semiconductor package base 12.

Figure 2:
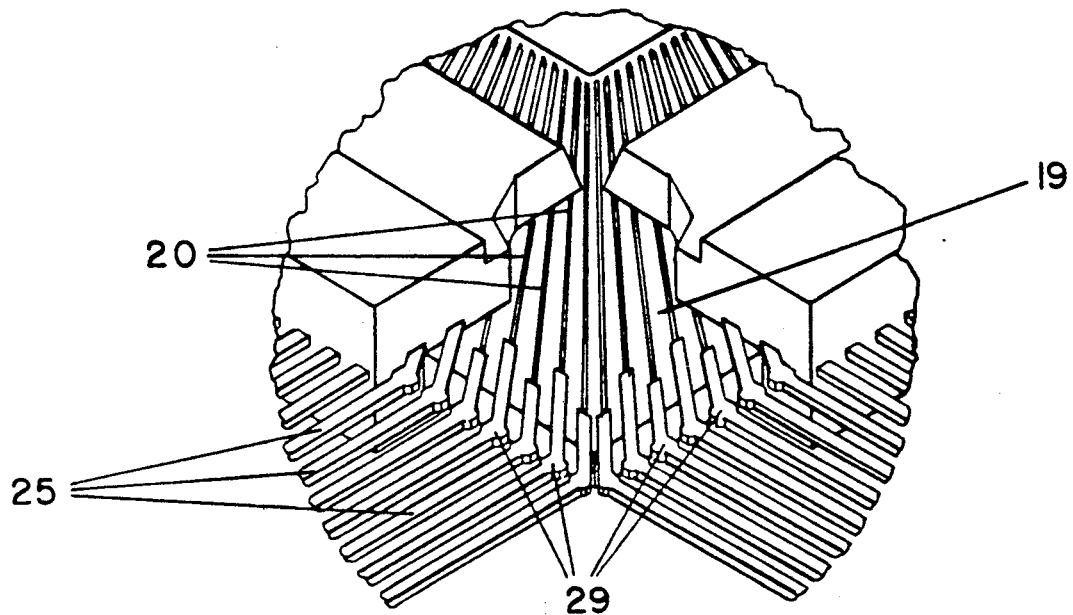
FIG. 2 is an enlarged view of the broken-away corner of the package of FIG. 1, and shows the interconnection between conductive traces on a polyimide substrate and the lead frame of the package of FIG. 1.

FIG. 2 is an enlarged view of a corner of package 11 in FIG. 1 and shows the connection between the conductive traces 20 of polyimide substrate 19 and the external leads 25 of lead frame 23 of package 11.

This ultrasonic welding method may be used to attach a lid to any type of plastic cavity semiconductor package base. For example, turning to FIG. 3, the inventive method may be used to attach a lid 15a to the base of a plastic dual in-line package 31. Plastic dual in-line package 31 includes a single stage injection molded BR-77 RYTON thermoplastic body 33 having an open cavity 39, a high temperature polyimide substrate 35, and a lead frame 37.

The lid 15a is attached to plastic dual in-line package base 31 by the same ultrasonic welding process that was discussed with regard to package 11 in FIG. 1.

Body 33 includes a bottom, sides, and a top which are injection molded in one step. Polyimide circuit substrate 35 includes conductive traces plated on the substrate 35 with gold, typically, as required. Lead frame 37 includes alloy and plating as required, with an integrated retention feature such as the enlarged retention portions 29 shown in FIG. 2.

Figure 3:
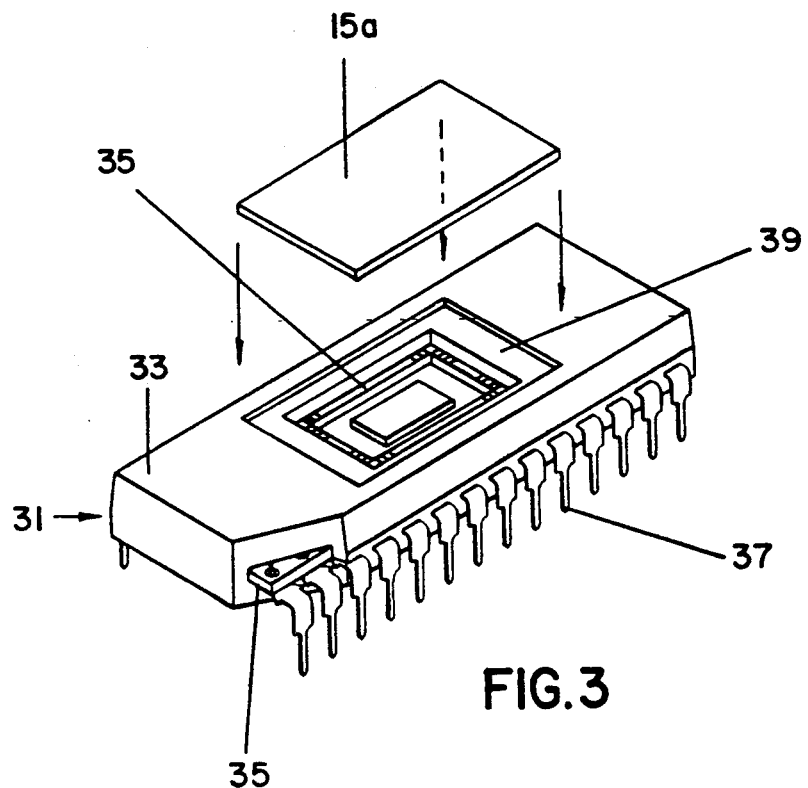
FIG. 3 is an exploded isometric view of a plastic dual in-line cavity type semiconductor package with a lid, illustrating a combination of a substrate circuit and lead frame, and shows a broken-away corner of the package.
Figure 4:
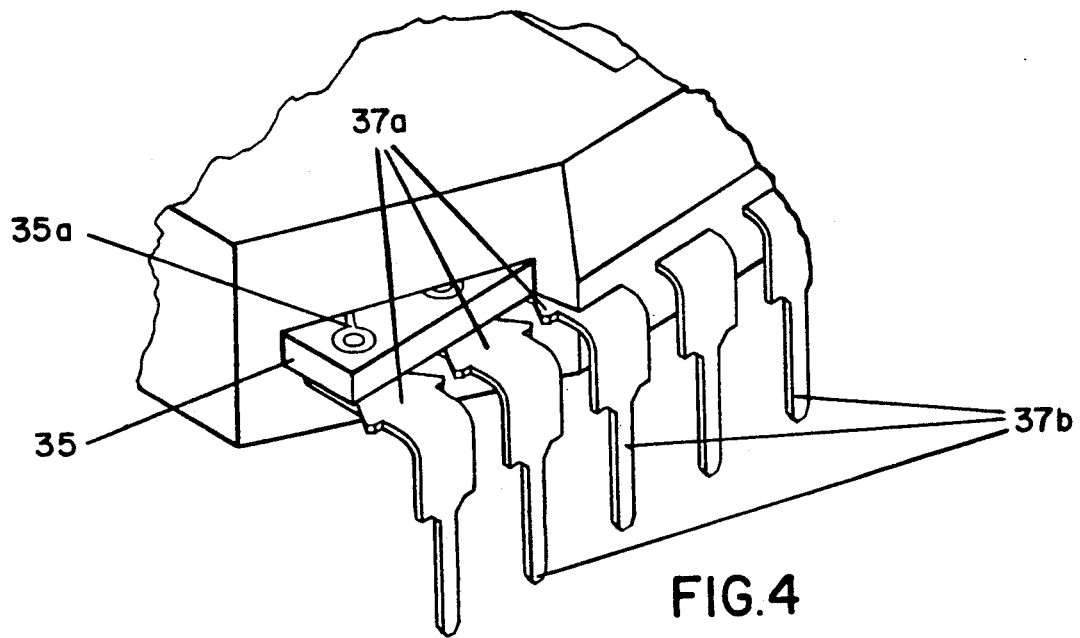
FIG. 4 is an enlarged view of the broken-away corner of the package of FIG. 3, and shows the interconnection between the conductive traces on a polyimide substrate and the lead frame of the package of FIG. 3.

FIG. 4 is an enlarged view of a corner of package 31 in FIG. 3, and shows the connection between the conductive traces 35a of polyimide substrate 35 and the external leads 37b of lead frame 37, which includes an integral retention feature provided by the enlarged portion 37a of external leads 37. The thermoplastic material of body 33 forms around enlarged portions 37a to prevent pull out of the leads 37 from body 33.

Figure 5:
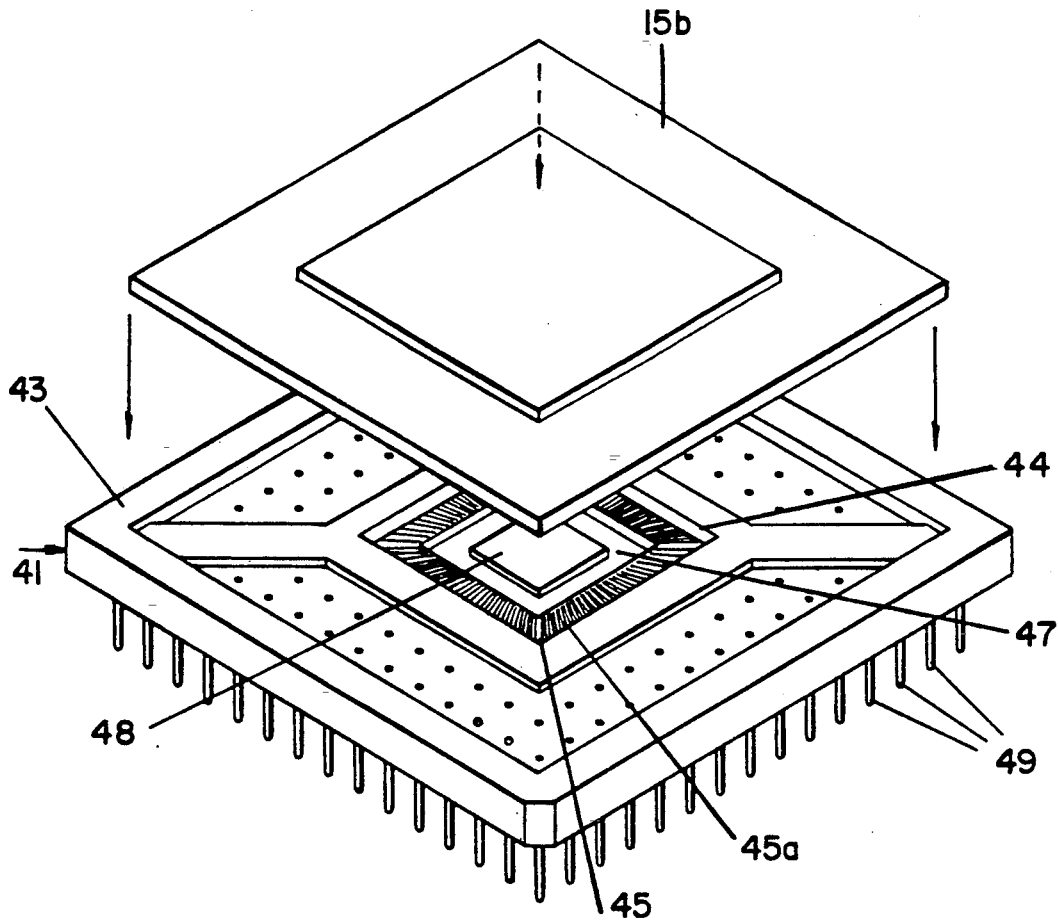
FIGS. 5 is an exploded isometric view of a plastic pin grid array cavity type semiconductor package with a lid.
Figure 5A:
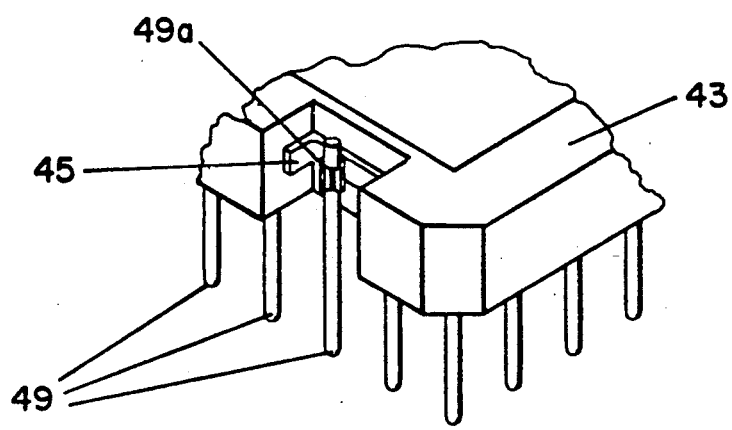
FIG. 5a shows an enlarged view of a section of the package of FIG. 5, illustrating an integral retention feature located on a conductive pin.
Figure 6:
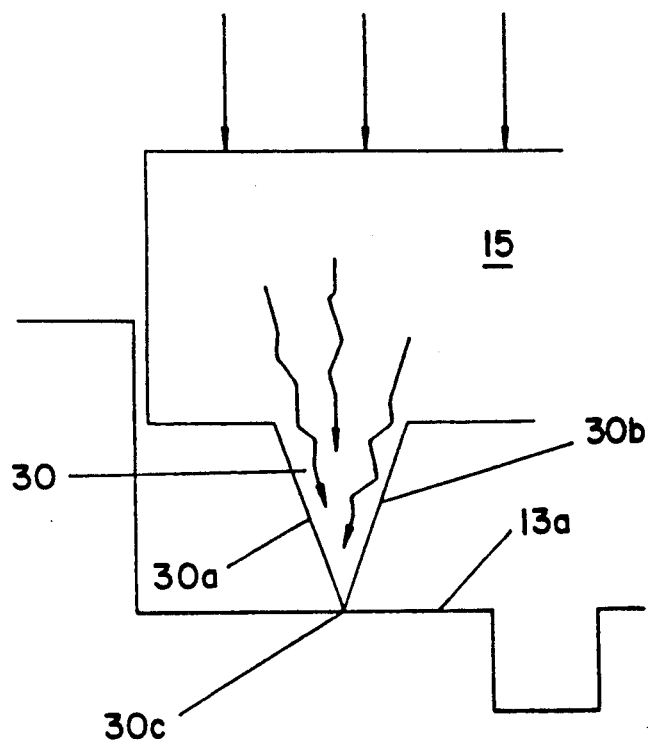
FIGS. 6-10 show progressive steps in the ultrasonic welding of the lid to the base.
Figure 7:
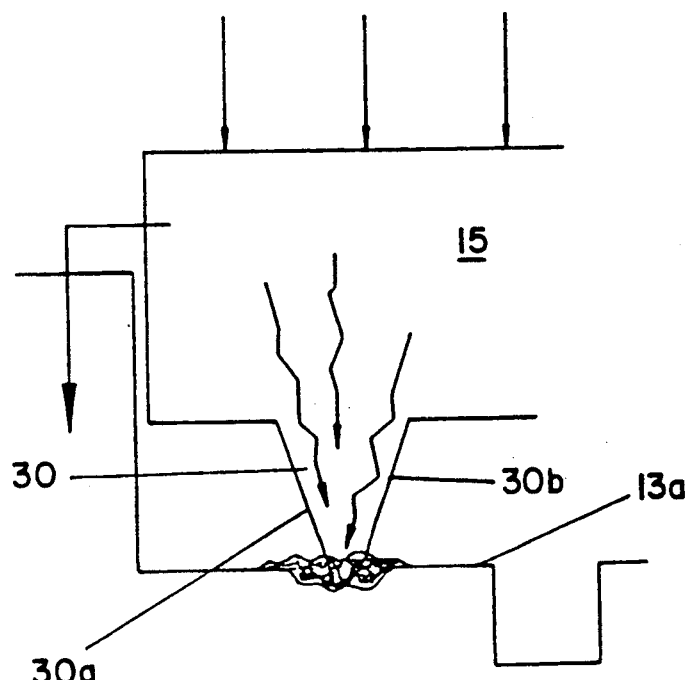
Figure 8:
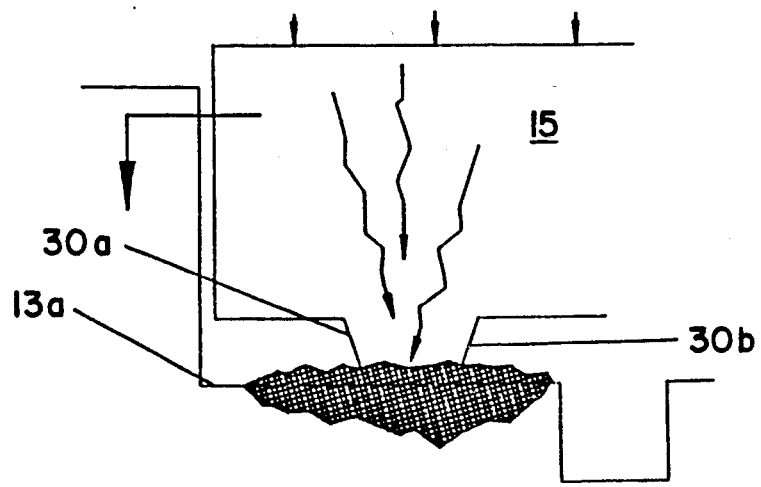
Figure 9:
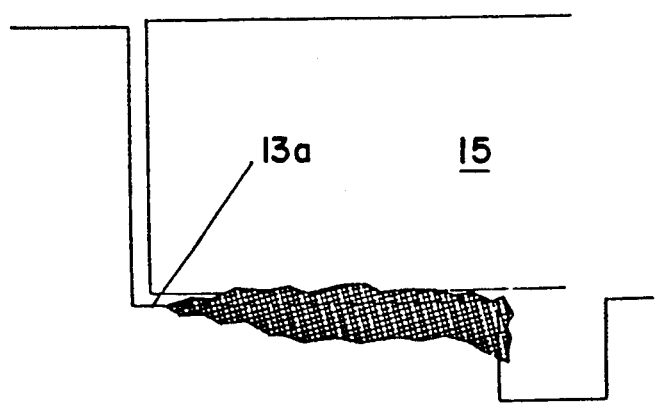

Turning now to FIG. 5, there is shown a plastic pin grid array semiconductor package 41 which includes a single stage injection molded BR-77 RYTON thermoplastic base or body 43 having an open cavity 44, a high temperature polyimide circuit substrate 45, an integrated alloy heat sink die pad 47, a die 48, and pins 49.

A lid 15b is provided that covers main body 43 and open cavity 44, and the lid 15b is attached to plastic pin grid array semiconductor package base 43 by the same ultrasonic welding process that was discussed with regard to package 11 in FIG. 1.

Body 43 includes a bottom and sides which are injection molded in one step. Polyimide circuit substrate 45 includes circuit traces 45a plated as required.

Alloy die pad 47 is also plated as required. Pins 49 may be made of beryllium-copper or brass, with an integrated retention feature such as an enlarged portion 49a encapsulated in the plastic, and is plated as required.

Figure 10:
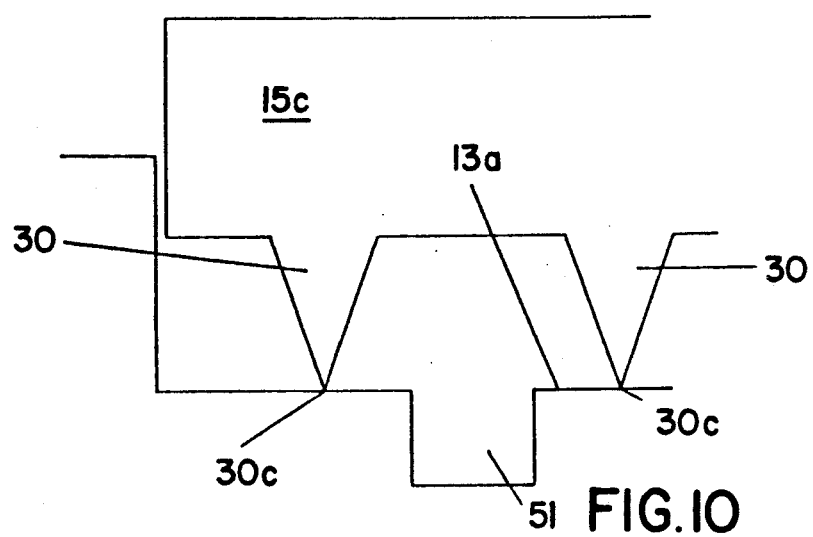

Turning to FIG. 10, lid 15c may include a single or multiple arrangement of energy directors or ridges 30 and the energy directing ridges 30 in FIG. 10 are positioned one on each side of a flash chamber 51 which collects any flash material produced by the ultrasonic welding. The lid 15 may be made of a single material, typically BR-77 RYTON thermoplastic, or a combination of materials and may be metallic or non-metallic, just so it is weldable by ultrasonic welding. The lid 15c is designed to fit open cavity 13a in the base 12 or may be a portion of a larger package cover. The lid 15c does not define a direction, either top or bottom of the package.

Figure 11:
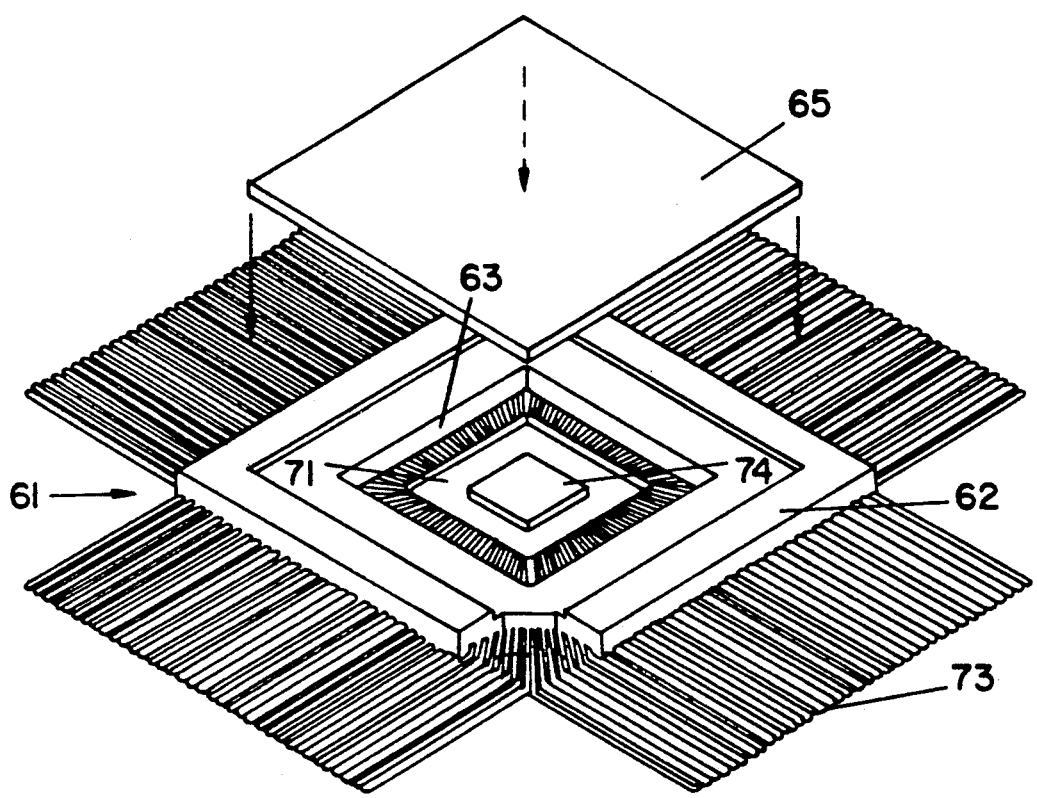
FIG. 11 is an exploded isometric view of a plastic quad flat pack cavity type semiconductor package with a lid, illustrating the use of a lead frame throughout, and shows a broken-away corner of the package.

Turning now to FIG. 11, package 61 is a cavity type plastic quad flat pack package, and includes a single stage injection molded thermoplastic base or body 62, preferably made of BR-77 RYTON thermoplastic sold by Phillips Petroleum Company, Bartlesville, Okla., an open cavity 63, a lid 65 that is affixed to the top of base or body 62, a die pad 71, a die 74 mounted on die pad 71 of lead frame 73 with external leads 75.

The bottom sides and top of body 62 are injection molded in one step. Lead frame 73 includes alloy and plating as required, with an integral retention feature provided by the enlarged portions 79 of external leads 75.

Figure 12:
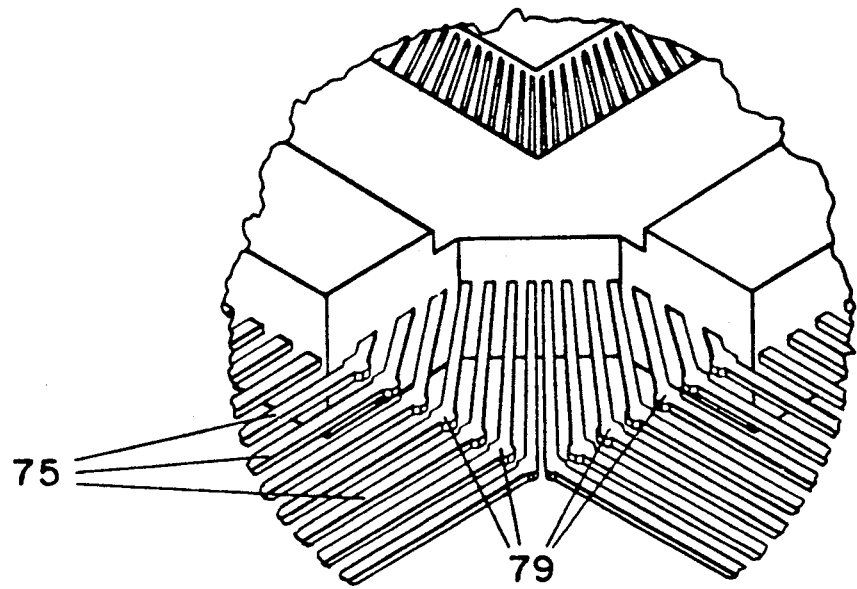
FIG. 12 is an enlarged view of the broken-away corner of the package of FIG. 11, and shows the integral retention feature located on the conductive lead frame.

FIG. 12 is an enlarged view of a corner of package 61 in FIG. 11 and shows the enlarged portions 79 of external leads 75.

The lid is attached to the plastic quad flat package base 62 by the same ultrasonic welding process that was discussed with regard to package 11 in FIG. 1.

The ultrasonic welding method, again, may be used to attach a lid to any type of plastic cavity semiconductor package base. For example, turning to FIG. 13, this method may be used to attach lid 81 to the body or base 83 of a plastic dual in-line package 85. Plastic dual in-line package 85 includes a single stage injection molded BR-77 RYTON thermoplastic body 83 having an open cavity 87, and a die pad 89 of a lead frame 91 with external leads 93.

The bottom, sides and top of body or base 83 are injection molded in one step. Lead frame 91 includes alloy and plating as required, with an integral retention feature provided by the enlarged portions 95 of the external leads 93.

Figure 13:
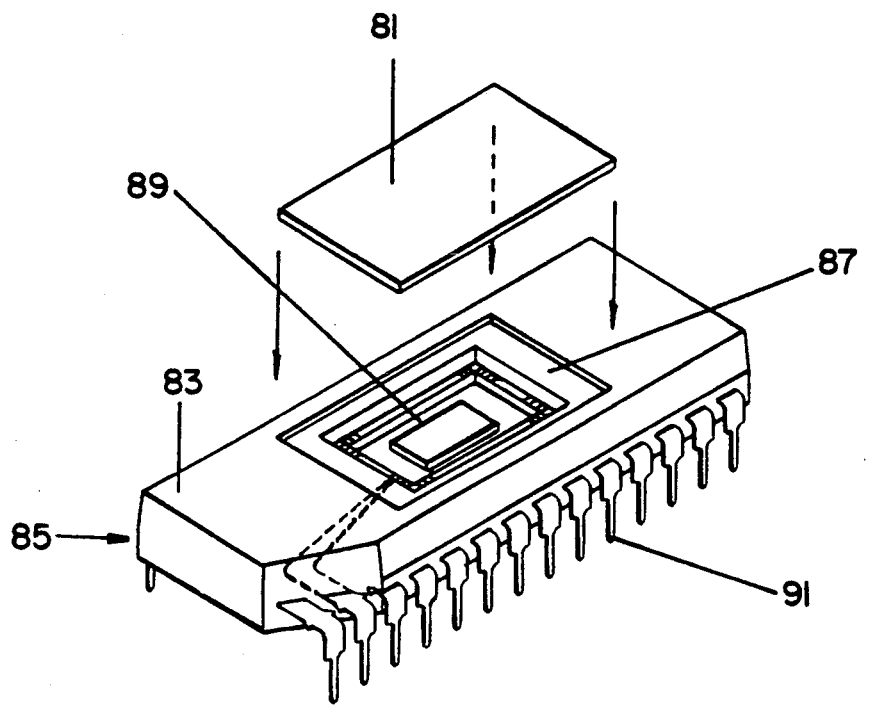
FIG. 13 is an exploded isometric view of a plastic dual in-line cavity semiconductor package with a lid, illustrating the use of a conductive lead frame throughout, and shows a broken-away corner of the package.
Figure 14:
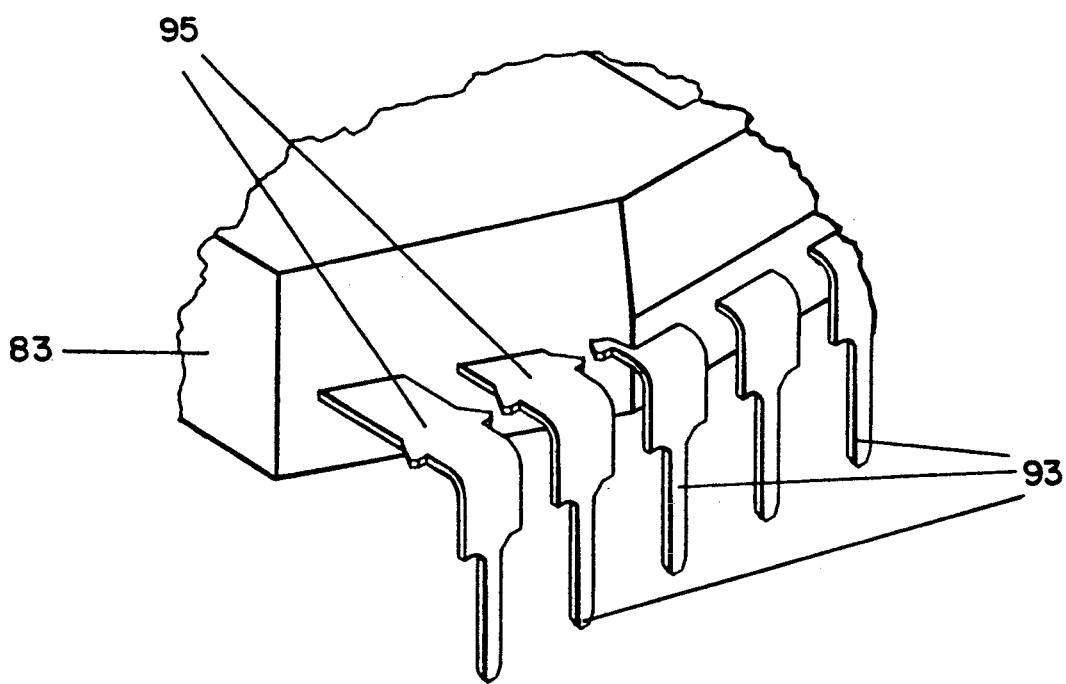
FIG. 14 is an enlarged view of the broken-away corner of the package of FIG. 13, and shows the integral retention feature located on the conductive lead frame.

FIG. 14 is an enlarged view of a corner of package 85 in FIG. 13 and shows the enlarged portions 95 of external leads 93.

The lid 81 is attached to the plastic dual in-line package base 83 by the same ultrasonic welding process that was discussed with regard to package 11 in FIG. 1.

In assembling the package 11, an inert gas, such as argon or nitrogen, may be directed toward the interface between lid 15 and package base 12. The inert gas is directed to the interface through a number of nozzles so that the inert gas disperses and/or removes potentially contaminated or polluted or moisturized atmosphere from the interface between lid 15 and package base 12, cavity 13 and localized surrounding areas.

The attachment of lid 15 to plastic cavity type semiconductor package body 12 takes place after the die is attached to the die pad of the lead frame, after the wire bonding, and after the sealant is dispensed over the die and its connections in the cavity.

The above described assembly process produces a suitable, semi-hermetic mechanical bond between the lid and the plastic package base and eliminates a laborious application of a bonding agent, eliminates losses due to bonding agent contamination or due to moisture contamination, eliminates wire sweeping due to over molding or blob topping, eliminates failures due to separation of the lid from the plastic cavity type semiconductor body, and eliminates stress induced by thermal cycling.

I claim:
1. A semiconductor package comprising
   a thermoplastic body having an open cavity formed therein,
   a lead frame having a die pad mounted in the cavity,
   a die mounted on the die pad of the lead frame,
   connecting means connecting the die to the lead frame,
   a thermoplastic lid attached to the body and covering the cavity,
   integral energy directing ridge means comprising a ridge mounted on the lid for directing ultrasonic energy when it is applied to the lid to melt a contact area between the lid and the body when the lid is being ultrasonically welded to the body, and
   a flash chamber in the body positioned near the ridges for collecting any flash material produced when the contact area is melted.
2. The semiconductor package of claim 1
   the lead frame having external leads partly encapsulated in the thermoplastic body, and retainer means on the leads and encapsulated by the thermoplastic of the body for preventing pull out of the lead from the body.
3. The semiconductor package of claim 2, said retainer means being an enlarged portion of the lead which is encapsulated by the thermoplastic material of the body.
4. The semiconductor package of claim 1, wherein the semiconductor package is a plastic grid array package.
5. The semiconductor package of claim 1, wherein the semiconductor package is a plastic quad flat pack.
6. The semiconductor package of claim 1, wherein the semiconductor package is a plastic dual in-line package.
7. The semiconductor package of claim 1, the weld being a semi-hermetic mechanical bond between the lid and the body.
8. A semiconductor package made by a method comprising the steps of
   providing a base having an open cavity,
   providing a lead frame and a die mounted on the lead frame in the cavity,
   providing a lid for the base that covers the open cavity,
   the lid and the base being made of a thermoplastic material that is weldable by ultrasonic welding, providing integral energy directing ridge means comprising a ridge mounted on the lid for directing ultrasonic energy toward the base, providing a flash chamber in the base positioned near the ridge means for collecting flash material, placing the lid on the base so that the lid covers the open cavity, holding the base in a fixed position, applying pressure to the lid to press the lid and the base together at a contact area, attaching the id to the base by applying ultrasonic energy to the lid, directing the energy toward the base with the ridge means, and melting the contact area between the lid and the base to ultrasonically seal the lid to the base, and collecting with the flash chamber any flash material produced when the contact area is melted.

9. A semiconductor package made by a method comprising the steps of providing a semiconductor package base having an open cavity, providing a lead frame and a die mounted on the lead frame in the cavity, providing a lid for the base that covers the open cavity, the lid and the base being made of a thermoplastic material that is weldable by ultrasonic welding, providing an integral energy directing ridge means comprising a ridge mounted on the lid for directing ultrasonic energy toward the base, providing a flash chamber in the base positioned near the ridge means for collecting flash material, introducing an inert gas at a contact area between the lid and the base to remove contaminated or polluted or moisturized air from the contact area, from the open cavity portion, and from surrounding areas, placing the lid on the base so that the lid covers the open cavity, holding the base in a fixed position, applying pressure to the lid to press the lid and the base together, attaching the lid to the base by applying ultrasonic energy to the lid, directing the energy toward the base with the ridge means, and melting the contact area between the lid and the base to ultrasonically seal the lid to the base, and collecting with the flash chamber any flash material produced when the contact area is melted.

10. A semiconductor package made by a method comprising the steps of providing a base having an open cavity, providing a lead frame having a die pad, inner leads and outer leads for mounting in the cavity, providing a semiconductor die for mounting to the lead frame, providing a lid for mounting on the base, said lid having an inner face and an outer face, providing integral energy directing ridge means extending from the inner face of the lid for directing ultrasonic energy toward the base, mounting the die on the die pad of the lead frame, partly encapsulating the lead frame in thermoplastic material of the base leaving open the die pad and the inner ends of the inner leads of the frame, connecting the die to the inner ends of the lead frame, the lid and the base being made of a thermoplastic material that is weldable by ultrasonic welding, directing an inert gas to a contact area between the lid and the base to remove any contaminated air or moisture from the contact area and the cavity, placing the lid on the base so that the lid covers the open cavity and the ridge means contacts the base, holding the base in a fixed position, applying pressure to the lid to press the lid and the base together, attaching the lid to the base by applying ultrasonic energy to the lid, directing the energy toward the base with the ridge means, and melting the contact area between the lid and the base to ultrasonically seal the lid to the base, and collecting with the flash chamber any flash material produced when the contact area is melted.

11. A semiconductor package including a thermoplastic body having an open cavity formed therein, a lead frame having a die pad mounted in the body, a die mounted on the die pad of the lead frame, connecting means connecting the die to the lead frame, a thermoplastic lid attached to the semiconductor body and covering the cavity, an ultrasonic weld between the lid and the body, integral energy directing ridge means comprising ridges having sides that slant toward each other and join together at a line for directing ultrasonic energy when it is applied to the lid to melt the material at the bottom of the ridge when the lid is being ultrasonically welded to the base, and a flash chamber in the base positioned near the ridges for collecting any flash material produced by the welding step.

12. A semiconductor package comprising, a thermoplastic body having an open cavity formed therein, a lead frame having a die pad mounted in the body, a die mounted on the die pad of the lead frame, connecting means connecting the die to the lead frame, a thermoplastic lid attached to the body and covering the cavity, an ultrasonic weld between the lid and the body, an integral energy directing ridge means comprising a ridge mounted on the lid for directing ultrasonic energy when it is applied to the lid to melt the contact area between the lid and the base to weld them together, a flash chamber formed in the base for collecting any flash material produced by the welding operation, the lead frame having external leads partly encapsulated in the thermoplastic body, retainer means on the leads and encapsulated by the thermoplastic of the body for preventing pull out of the lead frame from the body, and said retainer means being an enlarged portion of the lead which is encapsulated by the thermoplastic material of the body.

* * * * *